(12) United States Patent
Hori et al.

(10) Patent No.: US 11,611,009 B2
(45) Date of Patent: Mar. 21, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Masahiko Hori, Yokohama Kanagawa (JP); Tatsuo Tonedachi, Yamato Kanagawa (JP); Yoshinari Tamura, Yokohama Kanagawa (JP); Mami Fujihara, Nakatsu Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/465,520

(22) Filed: Sep. 2, 2021

(65) Prior Publication Data
US 2022/0302337 A1   Sep. 22, 2022

(30) Foreign Application Priority Data

Mar. 22, 2021  (JP) .............................. JP2021-047800

(51) Int. Cl.
*H01L 31/167*  (2006.01)
*H03K 17/785*  (2006.01)
(Continued)

(52) U.S. Cl.
CPC ........ *H01L 31/167* (2013.01); *H01L 31/0203* (2013.01); *H01L 31/02005* (2013.01); *H03K 17/785* (2013.01)

(58) Field of Classification Search
CPC ............ H01L 31/167; H01L 31/02005; H01L 31/0203; H03K 17/785
See application file for complete search history.

(56) References Cited

U.S. PATENT DOCUMENTS 7,166,919 B2   1/2007   Tabira
9,837,337 B2  12/2017   Kobayashi
(Continued)

FOREIGN PATENT DOCUMENTS

JP       3789443 B2      6/2006
JP    2013239644 A     11/2013
(Continued)

*Primary Examiner* — Sitaramarao S Yechuri
(74) *Attorney, Agent, or Firm* — Kim & Stewart LLP

(57) ABSTRACT

According to one or more embodiments, a semiconductor device includes a mounting substrate and a semiconductor element on the mounting substrate. The mounting substrate has a first electrode pad and a second electrode pad. The semiconductor element has a supporting substrate, third and fourth electrode pads, first slits and second slits. The third and fourth electrode pads are provided on a first surface of the supporting substrate facing the mounting substrate. The first slits are provided both in the supporting substrate and in the third electrode pad. The second slits are provided both in the supporting substrate and in the fourth electrode pad. The semiconductor device further includes a first conductive bonding agent that connects the first electrode pad to the third electrode pad and a second conductive bonding agent that connects the second electrode pad to the fourth electrode pad.

26 Claims, 5 Drawing Sheets

(51) Int. Cl.
*H01L 31/0203* (2014.01)
*H01L 31/02* (2006.01)

(56) References Cited

U.S. PATENT DOCUMENTS

| | | | | |
|---|---|---|---|---|
| 2002/0053742 | A1* | 5/2002 | Hata | H01L 24/97 257/692 |
| 2003/0042403 | A1* | 3/2003 | Joshi | H01L 31/173 250/214.1 |
| 2006/0162958 | A1* | 7/2006 | Miya | H05K 1/111 174/255 |
| 2013/0307014 | A1 | 11/2013 | Yamamoto et al. | |
| 2015/0069423 | A1* | 3/2015 | Yamamoto | H01L 31/0203 257/782 |
| 2020/0058598 | A1* | 2/2020 | Ishida | H01L 21/4828 |
| 2021/0175221 | A1 | 6/2021 | Tonedachi | |

FOREIGN PATENT DOCUMENTS

| | | | |
|---|---|---|---|
| JP | 2016103502 | A | 6/2016 |
| JP | 6453625 | B2 | 1/2019 |
| JP | 2019219567 | A | 12/2019 |

* cited by examiner

SEMICONDUCTOR DEVICE

CROSS-REFERENCE TO RELATED APPLICATION(S)

This application is based upon and claims the benefit of priority from Japanese Patent Application No. 2021-047800, filed Mar. 22, 2021, the entire contents of which are incorporated herein by reference.

FIELD

Embodiments described herein relate generally to a semiconductor device.

BACKGROUND

A photorelay including an optically coupled isolation circuit converts an input electrical signal into a light signal using a light-emitting element, then uses a light-receiving element to receive the light signal, and then outputs an electrical signal based on the received light signal. Owing to this design, the photorelay can, in effect, transmit an electrical signal between an input and an output that are electrically insulated from each other.

Multiple photorelays for alternating-current (AC) loads are used in a semiconductor tester that tests semiconductor integrated circuits and the like. As demand for wider bandwidth of a Dynamic Random-Access Memory (DRAM) rises, a semiconductor device configured with a photorelay that passes through a high-frequency signal at a frequency far higher than several GHz at a low loss is desired.

Hence, there is a need for a highly reliable semiconductor device.

DETAILED DESCRIPTION

According to one embodiment, a semiconductor device includes a mounting substrate and a semiconductor element on the mounting substrate. The mounting substrate has a first electrode pad and a second electrode pad. The semiconductor element has a supporting substrate, third and fourth electrode pads, first slits and second slits. The third and fourth electrode pads are provided on a first surface of the supporting substrate facing the mounting substrate. The first slits are provided both in the supporting substrate and in the third electrode pad. The second slits are provided both in the supporting substrate and in the fourth electrode pad. The semiconductor device further includes a first conductive bonding agent that connects the first electrode pad to the third electrode pad and a second conductive bonding agent that connects the second electrode pad to the fourth electrode pad.

Some example embodiments will be described hereinafter with reference to the accompanying drawings. In the following descriptions, the same or similar components, elements, members, and the like are denoted by the same reference signs.

In the present disclosure, an upward direction and a downward direction in each drawing depicting the embodiments can be referred to, respectively, as "upper" and "lower" to indicate a positional relationship among the components and the like. The terms "upper" and "lower" do not necessarily indicate a relationship with a gravity direction.

In the present embodiments, values of physical properties are those in a 25° C. ambient atmosphere.

First Embodiment

Figure 1:
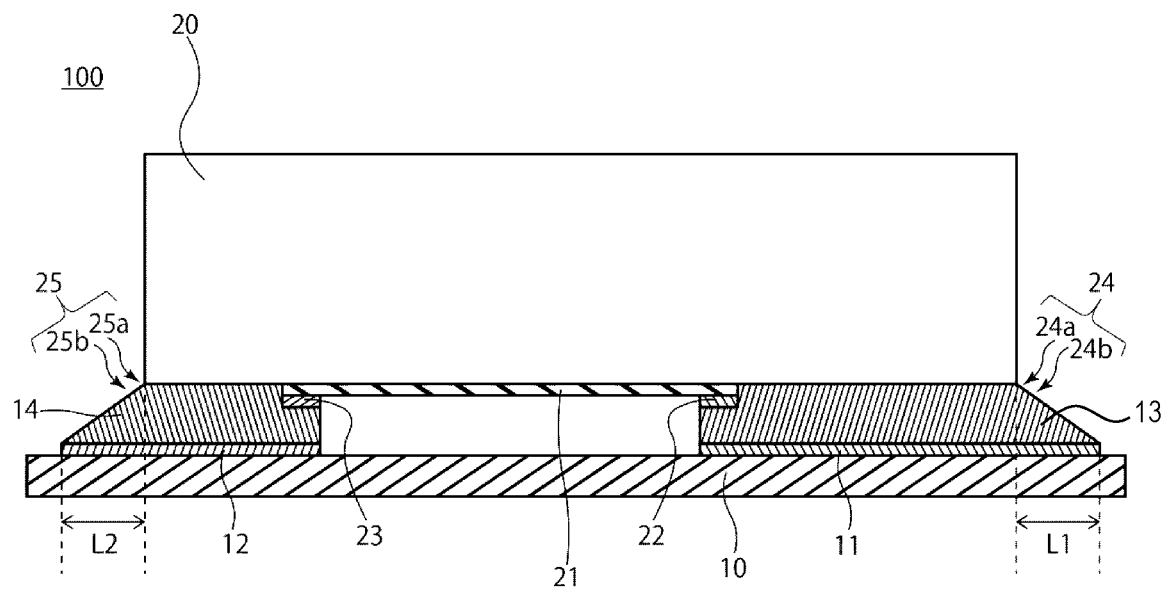
FIG. 1 depicts a semiconductor device in a schematic cross-sectional view according to a first embodiment.
Figure 2:
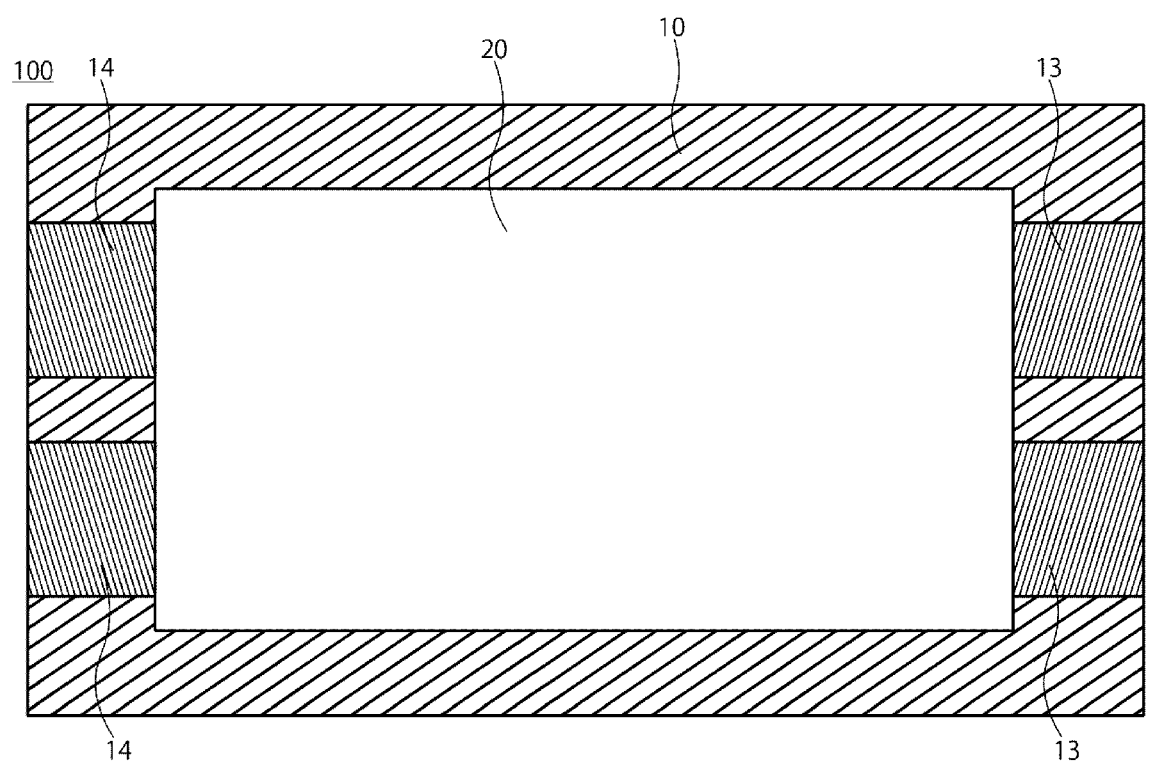
FIG. 2 depicts a semiconductor device in a schematic top view according to a first embodiment.

FIGS. 1 and 2 depict a semiconductor device in a schematic cross-sectional view and a schematic top view, respectively, according to a first embodiment.

A semiconductor device 100 includes a mounting substrate 10, a semiconductor element 20, a first conductive bonding agent 13, and a second conductive bonding agent 14.

The mounting substrate 10 is a substrate connected to the semiconductor element 20. The mounting substrate 10 is, for example, a printed circuit board. First electrode pads 11 and second electrode pads 12 are provided on a surface of the mounting substrate 10 facing the semiconductor element 20. There are two first electrode pads 11 and two second electrode pads 12 in the present embodiment.

The semiconductor element 20 is provided on the mounting substrate 10. The semiconductor element 20 has a supporting substrate 21, third electrode pads 22, and fourth electrode pads 23. The semiconductor element 20 is mounted on the mounting substrate 10 via the first conductive bonding agent 13 and the second conductive bonding agent 14. The semiconductor element 20 is, for example, a photorelay. The semiconductor element 20 has the supporting substrate 21 on a surface thereof facing the mounting substrate 10. There are two third electrode pads 22 and two fourth electrode pads 23 in the present embodiment.

The first electrode pads 11 of the mounting substrate 10 are positioned across from the third electrode pads 22 of the semiconductor element 20. The first electrode pads 11 overlap with the third electrode pads 22 in a perpendicular direction to the surface of the mounting substrate 10 facing the semiconductor element 20. To enable visual confirmation of a joint portion between the mounting substrate 10 and the semiconductor element 20, part of the first electrode pads 11 may protrude or extend outward of an outer periphery of the semiconductor element 20 in a surface direction of the mounting substrate 10 in the case where the first electrode pads 11 overlap with the semiconductor element 20 in the perpendicular direction to the surface of the mounting substrate 10 facing the semiconductor element 20 (that is in a perspective view in a direction from the semiconductor element 20 to the mounting substrate 10).

The second electrode pads 12 of the mounting substrate 10 are positioned across from the fourth electrode pads 23 of the semiconductor element 20. The second electrode pads 12 overlap with the fourth electrode pads 23 in the perpendicular direction to the surface of the mounting substrate 10 facing the semiconductor element 20. To enable visual confirmation of the joint portion between the mounting substrate 10 and the semiconductor element 20, part of the second electrode pads 12 protrude or extend outward of the outer periphery of the semiconductor element 20 in the surface direction of the mounting substrate 10 when the second electrode pads 12 overlap with the semiconductor element 20 in the perpendicular direction to the surface of the mounting substrate 10 facing the semiconductor element 20 (that is in the perspective view in the direction from the semiconductor element 20 to the mounting substrate 10).

In one example, the third electrode pads 22 and the fourth electrode pads 23 may not be provided at corners of the supporting substrate 21.

The first conductive bonding agent 13 is provided between the mounting substrate 10 and the semiconductor element 20 and electrically connects the semiconductor element 20 to the mounting substrate 10. The first electrode pads 11 of the mounting substrate 10 are connected to the third electrode pads 22 of the semiconductor element 20 by the first conductive bonding agent 13. The first conductive bonding agent 13 is, for example, a solder. To improve reliability of connection between the mounting substrate 10 and the semiconductor element 20, the first conductive bonding agent 13 may also be provided in first slits 24.

The second conductive bonding agent 14 is provided between the mounting substrate 10 and the semiconductor element 20 and electrically connects the semiconductor element 20 to the mounting substrate 10. The second electrode pads 12 of the mounting substrate 10 are connected to the fourth electrode pads 23 of the semiconductor element 20 by the second conductive bonding agent 14. The second conductive bonding agent 14 is, for example, a solder. To improve reliability of connection between the mounting substrate 10 and the semiconductor element 20, the second conductive bonding agent 14 may also be provided in second slits 25.

The first slits 24 are provided in the third electrode pads 22 and the supporting substrate 21 of the semiconductor element 20. Side surfaces of the third electrode pads 22 and side surfaces of the supporting substrate 21 are part of side surfaces of the semiconductor element 20. The side surfaces of the third electrode pads 22 are connected to the side surfaces of the supporting substrate 21. The third electrode pads 22 are stacked on the supporting substrate 21. A surface of each of the third electrode pads 22 facing the supporting substrate 21 comes in direct contact with a surface of the supporting substrate 21 facing the third electrode pads 22. The entire surface of each of the third electrode pads 22 facing the supporting substrate 21 comes in direct contact with the surface of the supporting substrate 21 facing the third electrode pads 22.

Figure 3:
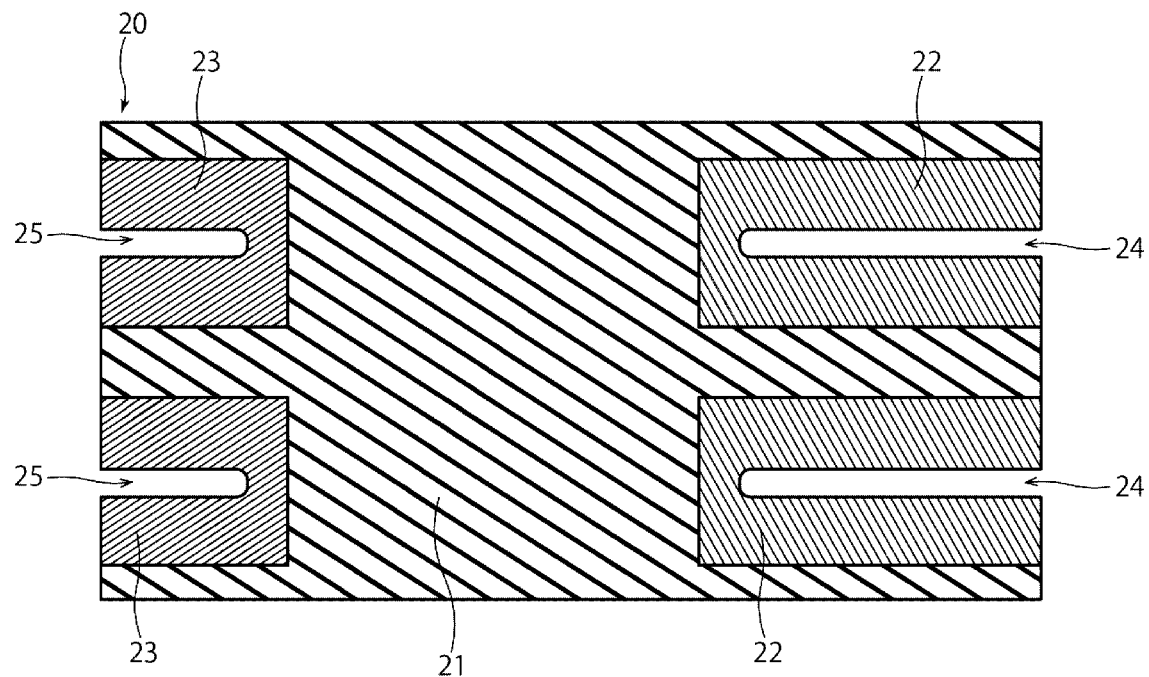
FIG. 3 is a schematic diagram of a supporting substrate according to a first embodiment.

As shown in the schematic diagram of the supporting substrate 21 of FIG. 3, the first slits 24 are provided extending from the outer periphery of the semiconductor element 20 toward a central region of the supporting substrate 21. An opening of each of the first slits 24 is located at the outer periphery of the semiconductor element 20. Surface tension at a time of joint facilitates entry of the first conductive bonding agent 13 into the first slits 24. Presence of the openings of the first slits at the outer periphery of the semiconductor element 20 facilitates spread of the first conductive bonding agent 13 from the openings to outside and facilitates confirmation of the joint portion between the semiconductor element 20 and the mounting substrate 10. If the openings of the first slits 24 are provided in the central region of the supporting substrate 21, this might cause an unintended short-circuit due to the spread of the first conductive bonding agent 13 into the central region, and/or a reduction in frequency characteristics of the semiconductor device 100. In the present embodiment, the first slit 24a provided in the supporting substrate 21 and the first slit 24b provided in each of the third electrode pads 22, for example, may collectively be referred to as "first slits 24" or individually as a "first slit 24."

In consideration of the frequency characteristics and workability, a shape of the first slit 24 (first slit 24a) provided in the supporting substrate 21 and a shape of the first slit 24 (first slit 24b) provided in each of the third electrode pads 22 may be identical or substantially identical. The first slits 24 penetrate the third electrode pads 22 and the supporting substrate 21 in a thickness direction. Members, components, elements, or the like within the semiconductor element 20 and the mounting substrate 10 are electrically connected to the supporting substrate 21 via the first slits 24.

To enable visual confirmation of the joint portion between the mounting substrate 10 and the semiconductor element 20, part of the first conductive bonding agent 13 protrudes or extends outward from the outer periphery of the semiconductor element 20 preferably by a length L1 (see FIG. 1) of 0.05 mm to 0.2 mm, more preferably 0.1 mm to 0.15 mm, when the first conductive bonding agent 13 overlaps with the semiconductor element 20 in the perpendicular direction to the surface of the mounting substrate 10 facing the semiconductor element 20 (that is, in the perspective view in the direction from the semiconductor element 20 to the mounting substrate 10).

The first conductive bonding agent 13 may have an inclined surface from outer peripheries of the third electrode pads 22 to outer peripheries of the first electrode pads 11. For example, the first conductive bonding agent 13 may have an inclined surface from the openings of the first slits 24 to the outer peripheries of the first electrode pads 11. Assessing and confirming the inclined surface enables evaluation of the connection between the semiconductor element 20 and the mounting substrate 10. A shape of the inclined surface of the first conductive bonding agent 13 may include a curved shape.

Interiors of the first slits 24 may be plated with a metal such as Cu. The internal plating of the first slits 24 may be given on an inner side surface of the supporting substrate 21 in which the first slit 24 (first slit 24a) is formed, on inner side surfaces of the third electrode pads 22 in which the first slits 24 (first slits 24b) are formed, or on both the inner side surface of the supporting substrate 21 in which a first slit 24 is formed and the inner side surfaces of the third electrode pads 22 in which first slits 24 are formed.

A height of each of the first slit 24 may be equal to a sum of a thickness of the supporting substrate 21 and a thickness of each of the third electrode pads 22. The height of the first slit 24 is, for example, 10 μm to 100 μm. The height may be, for example, 25 μm to 75 μm. A width of the first slit 24 (that is, a width of the opening thereof) may be equal to or less than a half of a width of the side surface of each of the third electrode pads 22 in which the opening of the first slit 24 is provided. Depending on the length of the first slit 24, a larger width of the first slit 24 may result in reduction in strength of the supporting substrate 21. On the other hand, a smaller width of the first slit 24 may hinder effects of providing the first slit 24. Therefore, the width of the first slit 24 may be, for example, five 5 µm to 100 µm, or may be, for example, preferably 50 µm to 75 µm.

Unlike cylindrical vias, each first slit 24 extends in the surface direction of the supporting substrate 21. Connecting the mounting substrate 10 to the semiconductor element 20 via the first conductive bonding agent 13 in contact with the first slits 24 each larger in surface than vias makes it possible to improve the reliability of the connection. A length of each first slit 24 is larger than the height of the first slit 24 and larger than the width of the first slit 24. The length of the first slit 24 is preferably at least four times as large as the height of the first slit 24 and at least four times as large as the width of the first slit 24.

The second slits 25 are provided in the fourth electrode pads 23 and the supporting substrate 21 of the semiconductor element 20. Side surfaces of the fourth electrode pads 23 and the side surfaces of the supporting substrate 21 are part of the side surfaces of the semiconductor element 20. The side surfaces of the fourth electrode pads 23 are connected to the side surfaces of the supporting substrate 21. The fourth electrode pads 23 are stacked on the supporting substrate 21. A surface of each of the fourth electrode pads 23 facing the supporting substrate 21 comes in direct contact with the surface of the supporting substrate 21 facing the fourth electrode pads 23. The entire surface of each of the fourth electrode pads 23 facing the supporting substrate 21 comes in direct contact with the surface of the supporting substrate 21 facing the fourth electrode pads 23.

As shown in the schematic diagram of the supporting substrate 21 of FIG. 3, the second slits 25 may be provided extending from the outer periphery of the semiconductor element 20 toward the central region of the supporting substrate 21. An opening of each of the second slits 25 is located at the outer periphery of the semiconductor element 20. The surface tension at the time of joint facilitates the entry of the second conductive bonding agent 14 into the second slits 25. Presence of the openings of the second slits 25 at the outer periphery of the semiconductor element 20 facilitates spread of the second conductive bonding agent 14 from the openings to outside and facilitates confirmation of the joint portion between the semiconductor element 20 and the mounting substrate 10. If the openings of the second slits 25 are provided extending into the central region of the supporting substrate 21, this may cause an unintended short-circuit due to the spread of the second conductive bonding agent 14 toward the central region, and/or a reduction in frequency characteristics of the semiconductor device 100. In the present embodiment, a second slit 25a provided in the supporting substrate 21 and a second slit 25b provided in each of the fourth electrode pads 23 may be collectively referred to "second slits 25" or individually as a "slit 25."

In consideration of the frequency characteristics and the workability, a shape of the second slit 25 (second slit 25a) provided in the supporting substrate 21 and a shape of the second slit 25 (second slit 25b) provided in each of the fourth electrode pads 23 are identical or substantially identical. The second slits 25 penetrate the fourth electrode pads 23 and the supporting substrate 21 in the thickness direction. Members, components, elements, or the like within the semiconductor element 20 and the mounting substrate 10 are electrically connected to the supporting substrate 21 via the second slits 25.

To enable visual confirmation of the joint portion between the mounting substrate 10 and the semiconductor element 20, part of the second conductive bonding agent 14 protrudes or extends outward from the outer periphery of the semiconductor element 20 by, for example, a length L2 (see FIG. 1) 0.05 mm to 0.1 mm when the second conductive bonding agent 14 overlaps with the semiconductor element 20 in the perpendicular direction to the surface of the mounting substrate 10 facing the semiconductor element 20 (that is in the perspective view in the direction from the semiconductor element 20 to the mounting substrate 10). The length L2 may be between 0.1 mm and 0.15 mm.

The second conductive bonding agent 14 may have an inclined surface from outer peripheries of the fourth electrode pads 23 to outer peripheries of the second electrode pads 12. For example, the second conductive bonding agent 14 may have the inclined surface from the openings of the second slits 25 to the outer peripheries of the second electrode pads 12. Assessing and confirming the inclined surface enables the evaluation of the connection between the semiconductor element 20 and the mounting substrate 10. A shape of the inclined surface of the second conductive bonding agent 14 may include a curved shape.

Interiors of the second slits 25 may be plated with a metal such as Cu. The internal plating of the second slits 25 may be given on the inner side surface of the supporting substrate 21 in which the second slit 25 (or the second slit 25a) is formed, on inner side surfaces of the fourth electrode pads 23 in which the second slits 25 (or the second slits 25b) are formed, or on both the inner side surface of the supporting substrate 21 in which the second slit 25 (or 25a) is formed and the inner side surfaces of the fourth electrode pads 23 in which the second slits 25 (or 25b) are formed.

A height of each of the second slits 25 may be equal to a sum of the thickness of the supporting substrate 21 and a thickness of each of the fourth electrode pads 23. The height of the second slit 25 is, for example, e 10 µm to 100 µm. The height may be preferably 25 µm to 75 µm. A width of the second slit 25 (that is a width of the opening thereof) may be equal to or less than a half of a width of the side surface of each of the fourth electrode pads 23 in which the opening of the second slit 25 is provided. Depending on the length of the second slit 25, a larger width of the second slit 25 may result in reduction in strength of the supporting substrate 21. On the other hand, a smaller width of the second slit 25 may hinder effects of providing the second slit 25. Therefore, the width of the second slit 25 may be, for example, 25 µm to 100 µm, or may be, for example, 50 µm to 100 µm.

Unlike cylindrical vias, each second slit 25 extends in the surface direction of the supporting substrate 21. Connecting the mounting substrate 10 to the semiconductor element 20 via the second conductive bonding agent 14 in contact with the second slits 25 each larger in surface than vias makes it possible to improve the reliability of the connection. A length of each second slit 25 is larger than the height of the second slit 25 and larger than the width of the second slit 25. The length of the second slit 25 may be at least four times as large as the height of the second slit 25 and at least four times as large as the width of the second slit 25.

Figure 4:
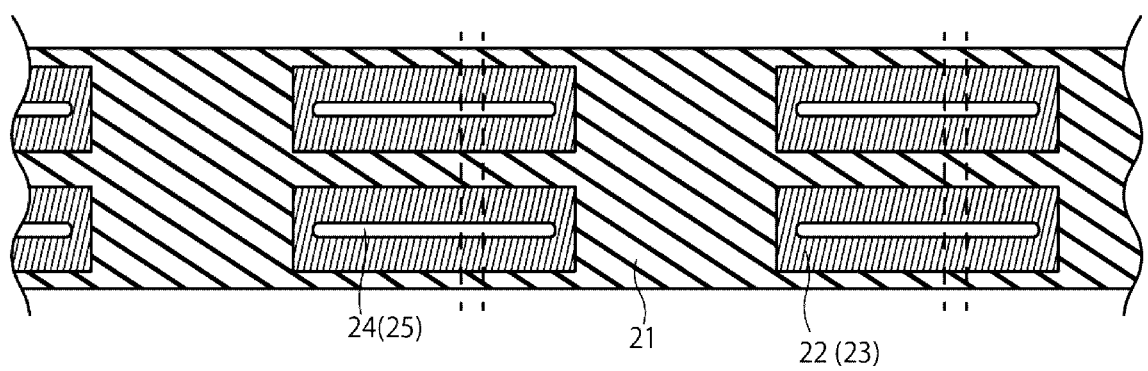
FIG. 4 is a process schematic diagram according to a first embodiment.

The supporting substrate 21 having the slits 24 and 25 according to the present embodiment can be obtained by, for example, processing a member, a component, an element, or the like as shown in FIG. 4 that depicts a process schematic diagram as one example according to the present embodiment. In the example, the supporting substrate 21 of the semiconductor element 20 can be obtained by preparing a member having a plurality of elongate electrode pads 22 (23) provided on the supporting substrate 21, forming a plurality of slits 24 (25), providing a plurality of electrode pads 22 (23) on a surface of the supporting substrate 21 opposite to the surface on which the elongate electrode pads 22 (23) are provided, and then dicing the member. By using laser for example, the slits 24 (25) penetrating the supporting substrate 21 and the electrode pads 22 (23) can be formed.

Figure 5:
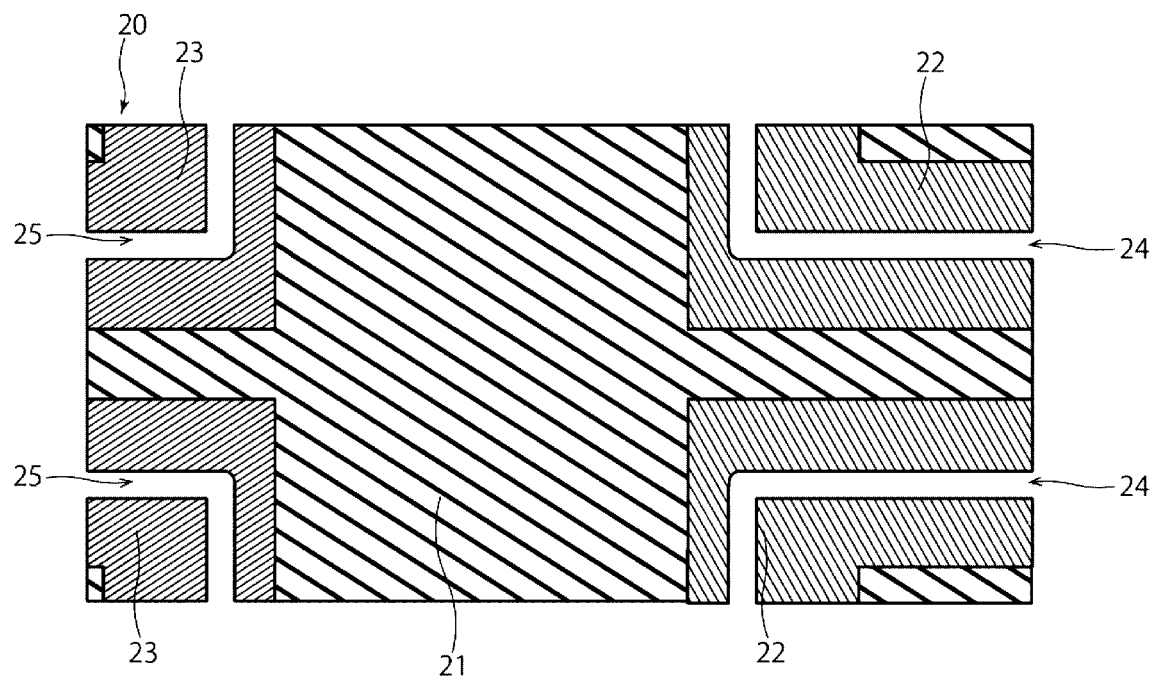
FIG. 5 is a schematic diagram of a supporting substrate according to a first embodiment.
Figure 6:
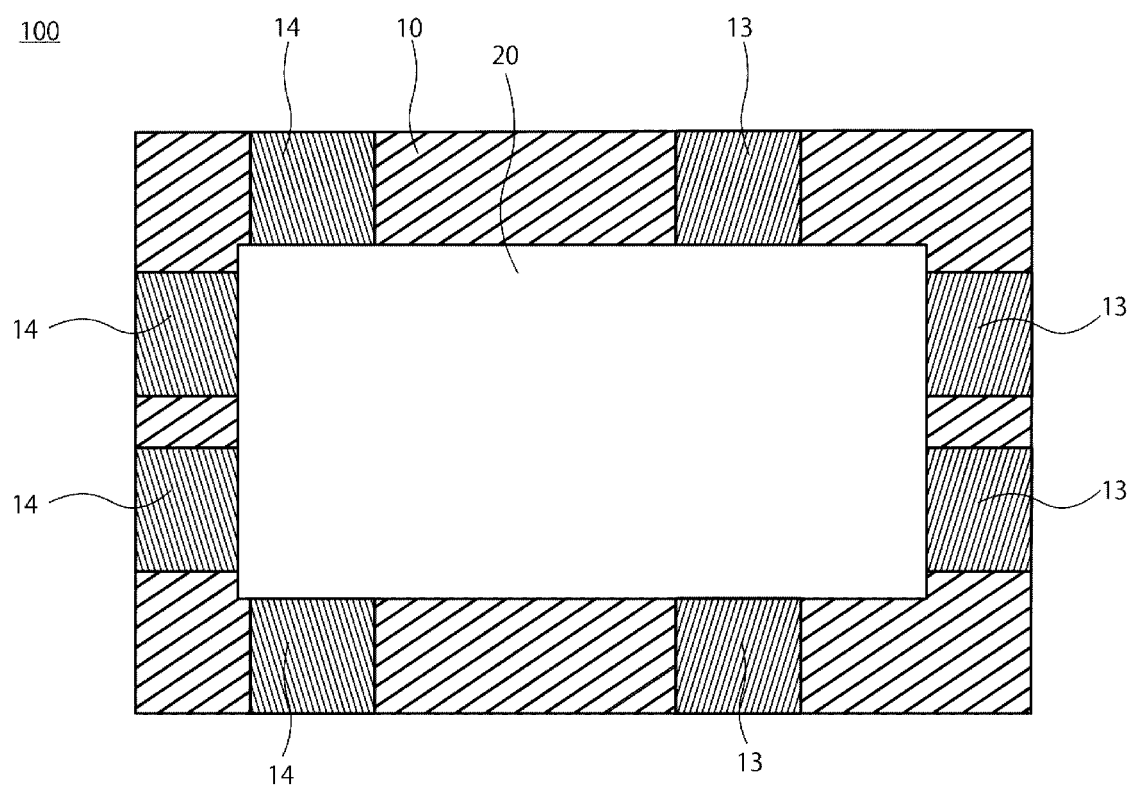
FIG. 6 depicts a semiconductor device in a schematic top view according to a first embodiment.

Two or more slits 24 (25) may be provided per electrode pad 22 (23). Each slit 24 (25) may have two openings bent within each electrode pad 22 (23). For example, as shown in FIG. 5 that depicts an example schematic diagram of the supporting substrate 21 according to the present embodiment, each first slit 24 is bent at a right angle within each third electrode pad 22 and has two openings in a side surface direction of the semiconductor element 20. Likewise, each second slit 25 is bent at a right angle within each fourth electrode pad 23 and has two openings in the side surface direction of the semiconductor element 20. If the semiconductor element 20 having the supporting substrate 21 and configured according to the present embodiment is used in the semiconductor device 100, the first conductive bonding agent 13, the second conductive bonding agent 14, or both of the first conductive bonding agent 13 and the second conductive bonding agent 14 extend from all of four side surfaces of the semiconductor element 20 toward the mounting substrate 10 and connect the semiconductor element 20 to the mounting substrate 10 as shown in FIG. 6 that depicts an example schematic top view of the semiconductor device 100 according to the present embodiment. In the case where the slit 24 (25) is bent, a length up to the bent portion of the slit 24 (25) corresponds to the length of the slit 24 (25).

Each of the first slits 24 and each of the second slits 25 may pass through a center of each of the third electrode pads 22 and a center each of the fourth electrode pads 23, respectively, or may be deviated or offset vertically. In the case of the first slits 24 and the second slits 25 as shown in the schematic diagram of FIG. 5, the slits 24 and 25 may be deviated not only vertically but also laterally.

Figure 7:
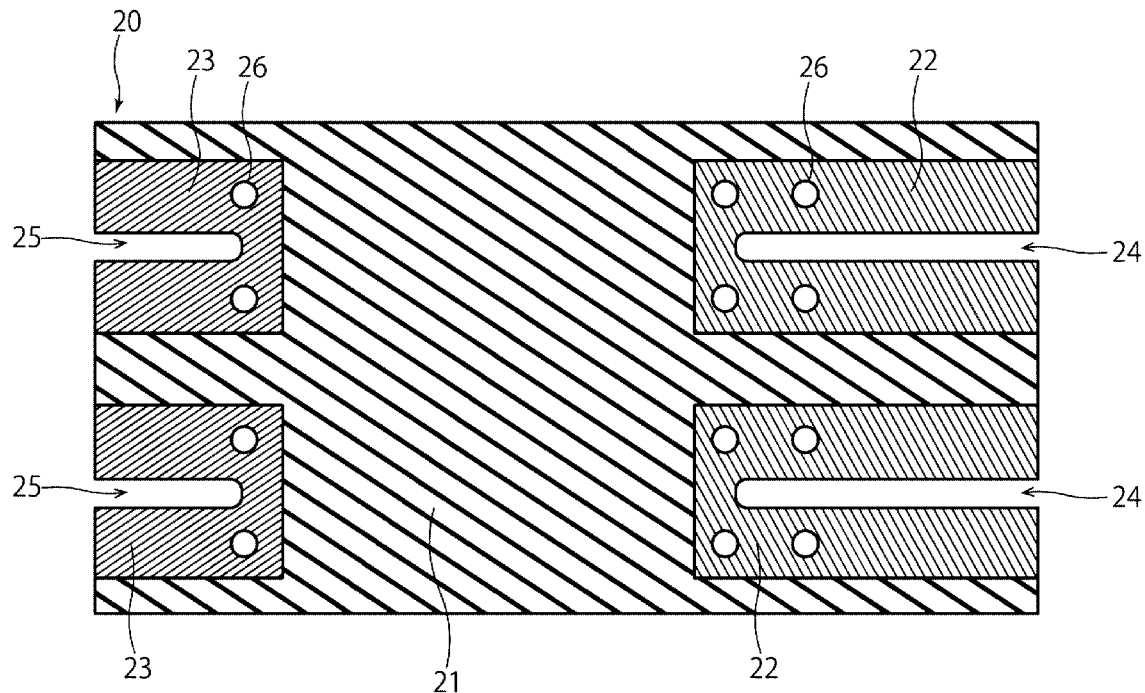
FIG. 7 is a schematic diagram of a supporting substrate according to a first embodiment.

Moreover, as shown in FIG. 7 that depicts another example schematic diagram of the supporting substrate 21 according to the present embodiment, not only the first slits 24 and the second slits 25 but also vias 26 may be provided in the supporting substrate 21.

Second Embodiment

Figure 8:
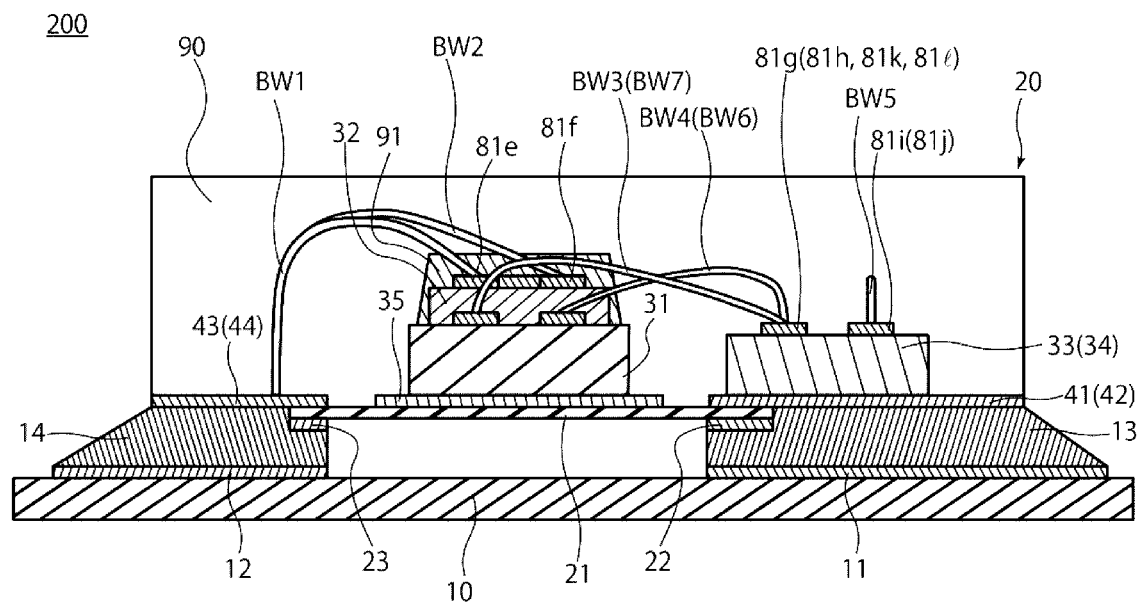
FIG. 8 depicts a semiconductor device in a schematic cross-sectional view according to a second embodiment.
Figure 9:
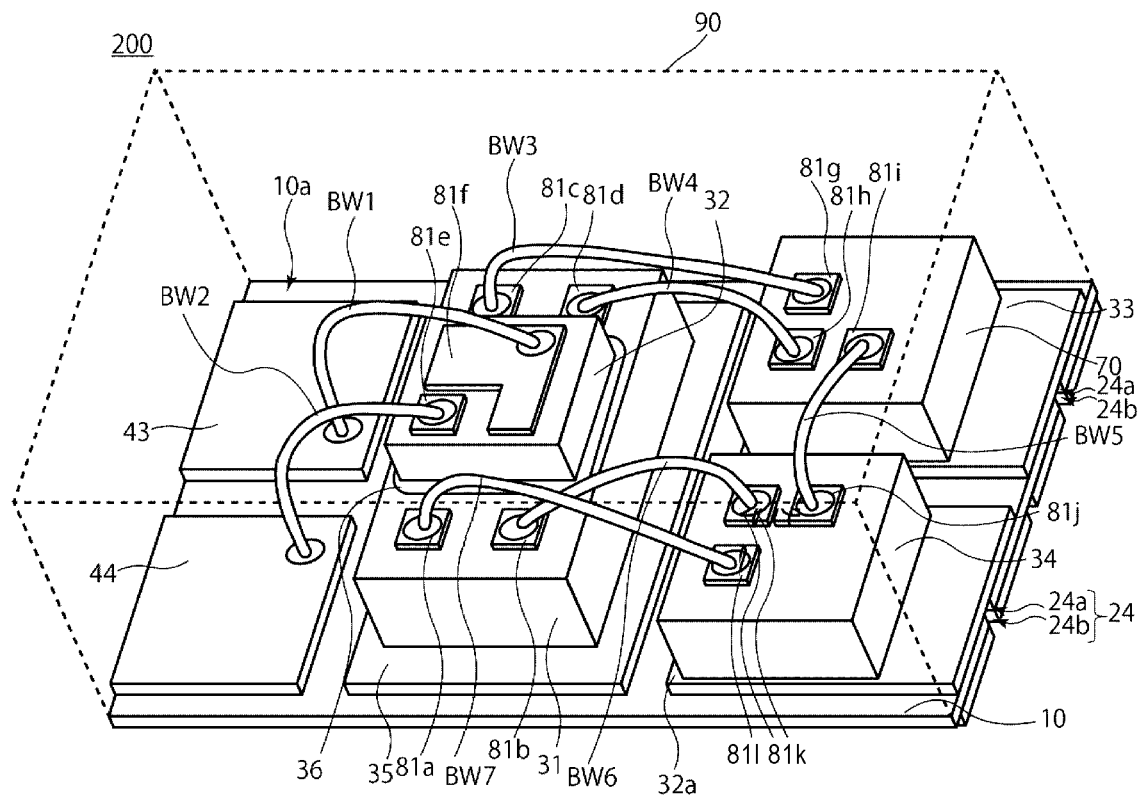
FIG. 9 depicts a photorelay in a schematic perspective view according to a second embodiment.

A second embodiment is a modification of the semiconductor device 100 according to the first embodiment. FIG. 8 depicts a semiconductor device 200 in a cross-sectional view according to the second embodiment. In the second embodiment, the semiconductor device 200 includes the semiconductor element 20 that is a photorelay. FIG. 9 shows a schematic perspective view of the photorelay as the semiconductor element 20.

The semiconductor element (or photorelay) 20 includes a light-receiving element 31 that has a light-receiving face on its upper surface, a light-emitting element 32 that irradiates the light-receiving face of the light-receiving element 31 with light, and metal-oxide-semiconductor field-effect transistors (MOSFETs) 33 and 34 as switching elements.

The MOSFETs 33 and 34 are adhesively bonded to output terminal portions 41 and 42, respectively. The light-receiving element 31 is adhesively bonded to a die pad portion 35. The semiconductor element (or photorelay) 20 also includes an adhesive layer 36 and a first encapsulation resin (or a first sealing resin) 90. The adhesive layer 36 exhibits light transparency and insulating properties and adhesively bonds the light-emitting element 32 onto the upper surface of the light-receiving element 31. As one example of the light-emitting element 32, a Light Emitting Diode (LED) may be used. As the light-receiving element 31, a photodiode, a phototransistor, a light-receiving IC, or the like may be used.

In the present embodiment shown in FIGS. 8 and 9, two MOSFETs 33 and 34 are provided in source common connection. Embodiments of the disclosure is not limited to this type. Only one MOSFET may be provided. In a case where a chip rear surface of each of the MOSFETs 33 and 34 is a drain, the output terminal portions 41 and 42 are connected to the drains of the MOSFETs 33 and 34, respectively.

The first encapsulation resin 90 covers the light-receiving element 31, the light-emitting element 32, the MOSFETs 33 and 34, and a first surface 10a of the mounting substrate 10, and protects interiors thereof. The light-emitting element 32 may be further encapsulated with a second encapsulation resin (or a second sealing resin) 91 (see FIG. 8).

A polyimide substrate may be used as the supporting substrate 21. The MOSFETs 33 and 34, the light-receiving element 31, the light-emitting element 32, and the like are provided on a rectangular first surface of the supporting substrate 21. The third electrode pads 22 and the fourth electrode pads 23 are provided on a second surface opposite to the first surface of the supporting substrate 21. The first slits 24 are provided in the third electrode pads 22. The second slits 25 are provided in the fourth electrode pads 23.

A thickness of the supporting substrate 21 may be set to be in a range of 10 μm to 120 μm. Using such a thin supporting substrate 21, which may be a polyimide substrate, makes it possible to improve pass filter characteristics in a high frequency band from 15 GHz to 30 GHz. To further improve the pass filter characteristics in the high frequency band of 15 GHz to 30 GHz, the thickness of the supporting substrate 21 may be 10 μm to 100 μm. To improve the pass filter characteristics in a higher frequency band of 20 GHz or more, the thickness of the supporting substrate 21 may be 10 μm to 60 μm, more preferably equal to or greater than 10 μm to 30 μm. Setting the thickness of the supporting substrate 21, which may be a polyimide substrate, smaller (for example, equal to or less than 60 μm) achieves further improvement of the pass filter characteristics in a higher frequency band. Because of such a thin supporting substrate 21, which may be a polyimide substrate, it is possible to improve the high-frequency pass filter characteristics.

The semiconductor element 20 has a plurality of output terminals, e.g., two output terminal portions 41 and 42. A length of each of the output terminal portions 41 and 42 is preferably 5 μm to 50 μm. The output terminal portions 41 and 42 are electrode pads and electrically connected to the third electrode pad 22 provided on the second surface of the supporting substrate 21. The first slits 24 are not provided in the output terminal portions 41 and 42.

The semiconductor element 20 has a plurality of input terminals, e.g., two input terminal portions 43 and 44. The input terminal portions 43 and 44 are electrode pads and electrically connected to the fourth electrode pad 23 provided on the second surface of the supporting substrate 21. A thickness of each of the input terminal portions 43 and 44 is preferably 5 μm to 50 μm. The second slits 25 are not provided in the input terminal portions 43 and 44.

The input terminal portions 43 and 44, the output terminal portions 41 and 42, and the die pad portion 35 may be formed from a Cu foil provided on the surface of the supporting (e.g., polyimide) substrate 21 and a plated layer, such as a Ni-plated or Au-plated layer, stacked on the Cu foil. Furthermore, in a view from above, the input terminal portions 43 and 44, the output terminal portions 41 and 42, and the die pad portion 35 are apart from and insulated from one another on the polyimide substrate 21.

The input terminal portion 43 is electrically connected to a pad 81f of a cathode of the light-emitting element 32 via a bonding wire BW1.

The input terminal portion 44 is electrically connected to a pad 81e of an anode of the light-emitting element 32 via a bonding wire BW2.

The light-receiving element 31 is electrically connected to gates and sources of the MOSFETs 33 and 34 via bonding wires BW3, BW4, BW6, and BW7. Pads 81a, 81b, 81c, and 81d of the light-receiving element 31 are electrically connected to pads 81g, 81h, 81k, and 81l of the MOSFETs 33 and 34 via the bonding wires BW3, BW4, BW6, and BW7.

The MOSFET 33, i.e., source of the MOSFET 33 is electrically connected to the MOSFET 34, i.e., source of the MOSFET 34 via a bonding wire BW5 that connects a pad 81i of the MOSFET 33 to a pad 81j of the MOSFET 34.

To realize the semiconductor device 200 having the high-frequency pass filter characteristics, the first conductive bonding agent 13 may not overlap with the light-receiving element 31 in the perpendicular direction to the surface of the mounting substrate 10 facing the semiconductor element 20, and the second conductive bonding agent 14 may not overlap with the light-receiving element 31 in the perpendicular direction to the surface of the mounting substrate 10 facing the semiconductor element 20.

The length of each of the first slits 24 may be shorter than a distance from the side surface of the semiconductor element 20 in which the opening of the first slit 24 is provided in each of the MOSFETs 33 and 34 to the opposite side surface of the semiconductor element 20. Such arrangement of the length of the first slit 24 prevents the first conductive bonding agent 13 from being located under the light-emitting element 32 and the light-receiving element 31 and achieves further improvement of the high-frequency pass filter characteristics.

The first slits 24 may overlap with the pads 81g, 81h, 81k, and 81l of the MOSFETs 33 and 34 in the perpendicular direction to the surface of the mounting substrate 10 facing the semiconductor element 20. The overlap of the first slits 24 with the pads 81g, 81h, 81k, and 81l of the MOSFETs 33 and 34 can achieve small interconnection distances from the pads 81g, 81h, 81k, and 81l of the MOSFETs 33 and 34 to the first electrode pads 11 of the mounting substrate 10. Accordingly, it is preferable that the length of each of the first slits 24 be greater than or equal to the distance from the side surface of the semiconductor element (or photorelay) 20 to each of the pads 81i and 81j, which are closer to the openings of the first slits 24, of the MOSFETs 33 and 34 and equal to or less than the distance from the side surface of the semiconductor element (or photorelay) 20 to each of the pads 81g, 81h, 81k, and 81l, which are opposite to the pads 81i and 81j closer to the openings of the first slits 24, of the MOSFETs 33 and 34.

The second slits 25 may overlap with bonding faces of the bonding wires BW1 and BW2 of the input terminal portions 43 and 44 in the perpendicular direction to the surface of the mounting substrate 10 facing the semiconductor element 20. The overlap of the second slits 25 with the bonding wires BW1 and BW2 of the input terminal portions 43 and 44 can achieve small interconnection distances from the input terminal portions 43 and 44 to the second electrode pads 12 of the mounting substrate 10.

Figure 10:
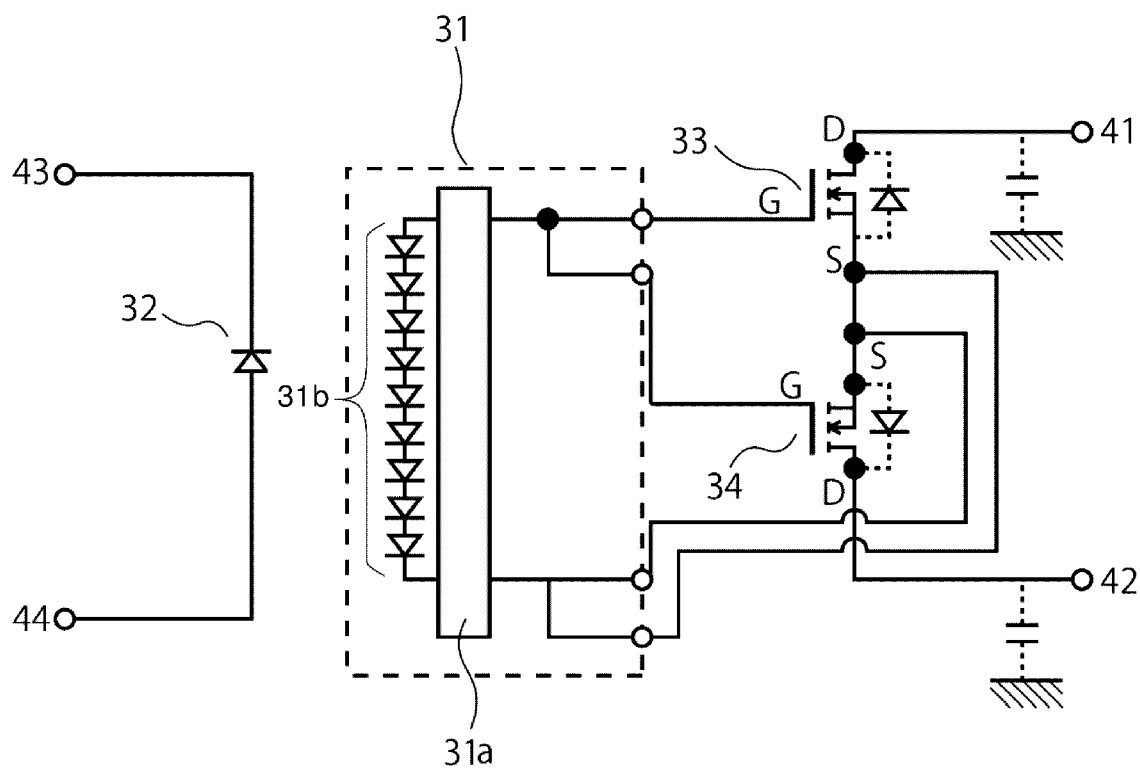
FIG. 10 depicts a configuration of a photorelay according to a second embodiment.

FIG. 10 depicts an example configuration of the photorelay as the semiconductor element 20 according to the second embodiment.

The light-receiving element 31 can further have a control circuit 31a. The control circuit 31a is connected to a first electrode and a second electrode of a photodiode array 31b. Configuring the light-receiving element 31 in this way makes it possible to supply a voltage to the gate of each of the MOSFETs 33 and 34 in the source common connection. Furthermore, the control circuit 31a includes a resistor and the like so that it is possible to discharge the gates of the MOSFETs 33 and 34 and to shorten fall time when the MOSFETs 33 and 34 change from an on-state to an off-state.

For example, n-channel enhancement MOSFETs may be used as the MOSFETs 33 and 34. In FIG. 10, gates G of the MOSFETs 33 and 34 are connected to an anode of the photodiode array 31b. Sources S of the MOSFETS 33 and 34 are connected to a cathode of the photodiode array 31b, and drains D thereof are connected to the output terminal portions 41 and 42, respectively.

When a light signal is turned on, the MOSFETs 33 and 34 are turned on and connected to an external circuit including a power supply and a load via the output terminal portions 41 and 42. When the light signal is turned off, the MOSFETs 33 and 34 are turned off and cut off from the external circuit. The source common connection enables linear output and facilitates switching of a high-frequency signal.

The two MOSFETs 33 and 34 are in the source common connection. Therefore, when the MOSFETs 33 and 34 are turned on, a high-frequency signal is supplied to the load of the external circuit. For example, increasing the number of bonding wires that connect the two source electrodes S with one another to two or more enables a reduction in source inductance. Furthermore, setting the two or more bonding wires non-parallel enables a further reduction in source inductance. Moreover, setting a diameter of each of the bonding wires closer to the MOSFETs 33 and 34 larger than a diameter of each of the bonding wires closer to the light-emitting element 32 enables a reduction in wire inductance. As a result, it is possible to reduce a transmission loss.

The semiconductor device 200 using the photorelay 20 according to the present embodiment can reduce the transmission loss of a high-frequency signal at, for example, 20 GHz or higher and yet ensuring high reliability. Owing to this, it is possible to measure high frequency characteristics of semiconductor devices including a high-speed DRAM under next-generation standards with high accuracy at high speed.

The semiconductor device 200 and/or the photorelay 20 according to present embodiments can be used in various semiconductor devices, such as industrial machines that include a semiconductor tester that tests an IC and the like.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a mounting substrate comprising a first electrode pad and a second electrode pad;
   a semiconductor element on the mounting substrate and comprising:
   a supporting substrate, a third electrode pad on a first surface of the supporting substrate facing the mounting substrate,
a fourth electrode pad on the first surface of the supporting substrate,
first slits in the supporting substrate and the third electrode pad, and
second slits in the supporting substrate and the fourth electrode pad;
a first conductive bonding agent connecting the first electrode pad to the third electrode pad; and
a second conductive bonding agent connecting the second electrode pad to the fourth electrode pad, wherein
the first electrode pad of the mounting substrate overlaps with the semiconductor element,
at least part of the first electrode pad protrudes outward from an outer periphery of the semiconductor element in a surface direction of the mounting substrate, and
at least part of the first conductive bonding agent has a surface inclined toward an outer periphery of the protruding part of the first electrode pad.

2. The semiconductor device according to claim 1, wherein each of the first and second slits is provided extending from an outer periphery of the semiconductor element toward a central region of the supporting substrate.

3. The semiconductor device according to claim 1, wherein
the first slits extend from a first side portion of the semiconductor element toward a central region of the supporting substrate, and
the second slits extend from a second side portion of the semiconductor element toward the central region of the supporting substrate, the second side portion being opposite to the first side portion.

4. The semiconductor device according to claim 1, wherein
a shape of the first slit in the supporting substrate is substantially identical to that of the first slit in the third electrode pad, and
a shape of the second slit in the supporting substrate is substantially identical to that of the second slit in the fourth electrode pad.

5. The semiconductor device according to claim 1, wherein
the second electrode pad of the mounting substrate overlaps with the semiconductor element,
at least part of the second electrode pad protrudes outward from an outer periphery of the semiconductor element in a surface direction of the mounting substrate, and
at least part of the second conductive bonding agent has a surface inclined toward an outer periphery of the protruding part of the second electrode pad.

6. The semiconductor device according to claim 1, wherein a length of each of the first slits is at least four times as large as a height of the first slits and at least four times as large as a width of the first slits.

7. The semiconductor device according to claim 1, wherein a length of each of the second slits is at least four times as large as a height of the second slits and at least four times as large as a width of the second slits.

8. The semiconductor device according to claim 1, wherein the first slits and the second slits do not extend into the central region of the supporting substrate.

9. The semiconductor device according to claim 1, wherein
the semiconductor element is a photorelay comprising a light-emitting element, a light-receiving element, a switching element, and a first bonding wire connecting the switching element to the light-receiving element,
the third electrode pad is connected to a drain electrode of the switching element, and
the first slits are directly under a connection portion between the first bonding wire and the switching element.

10. The semiconductor device according to claim 9, wherein a length of each of the first slits is less than a distance from a first side surface of the semiconductor element in which an opening of each of the first slits is provided in the switching element to a second side surface of the semiconductor element opposite to the first side surface.

11. The semiconductor device according to claim 9, wherein the first and second conductive bonding agents do not overlap with the light-receiving element.

12. A semiconductor device, comprising:
a mounting substrate comprising first and second electrode pads on a first surface; and
a semiconductor element bonded to the first surface of the mounting substrate via first and second conductive bonding agents, the semiconductor element comprising:
a supporting substrate on a second surface of the semiconductor element facing the first surface of the mounting substrate,
a third electrode pad on a first side portion of the semiconductor element, the first conductive bonding agent electrically connecting the third electrode pad to the first electrode pad,
a fourth electrode pad on a second side portion of the semiconductor element, the second side portion being opposite to the first side portion, the second conductive bonding agent electrically connecting the fourth electrode pad to the second electrode pad,
a first slit penetrating the supporting substrate and the third electrode pad in a thickness direction, and
a second slit penetrating the supporting substrate and the fourth electrode pad in the thickness direction, wherein
the first conductive bonding agent is in the first slit,
the second conductive bonding agent is in the second slit,
the first electrode pad of the mounting substrate overlaps with the second surface of the semiconductor element,
at least part of the first electrode pad protrudes outward from an outer periphery of the second surface of the semiconductor element, and
at least part of the first conductive bonding agent has a surface inclined from the second surface of the semiconductor element toward an outer periphery of the protruding part of the first electrode pad.

13. The semiconductor device according to claim 12, wherein
the first slit extends from the first side portion of the semiconductor element toward a central region of the supporting substrate, and
the second slit extends from the second side portion of the semiconductor element toward the central region of the supporting substrate.

14. The semiconductor device according to claim 12, wherein
the second electrode pad of the mounting substrate overlaps with the second surface of the semiconductor element, at least part of the second electrode pad protrudes outward from an outer periphery of the second surface of the semiconductor element, and at least part of the second conductive bonding agent has a surface inclined from the second surface of the semiconductor element toward an outer periphery of the protruding part of the second electrode pad.

15. The semiconductor device according to claim 12, wherein a length of the first slit is at least four times as large as a height of the first slit and at least four times as large as a width of the first slit.

16. The semiconductor device according to claim 12, wherein a length of the second slit is at least four times as large as a height of the second slit and at least four times as large as a width of the second slit.

17. The semiconductor device according to claim 12, wherein the semiconductor element is a photorelay.

18. A semiconductor device, comprising:
a mounting substrate comprising a first electrode pad and a second electrode pad;
a semiconductor element on the mounting substrate and comprising:
a supporting substrate,
a third electrode pad on a first surface of the supporting substrate facing the mounting substrate,
a fourth electrode pad on the first surface of the supporting substrate,
first slits in the supporting substrate and the third electrode pad, and
second slits in the supporting substrate and the fourth electrode pad;
a first conductive bonding agent connecting the first electrode pad to the third electrode pad; and
a second conductive bonding agent connecting the second electrode pad to the fourth electrode pad, wherein
the semiconductor element is a photorelay comprising a light-emitting element, a light-receiving element, a switching element, and a first bonding wire connecting the switching element to the light-receiving element,
the third electrode pad is connected to a drain electrode of the switching element, and
the first slits are directly under a connection portion between the first bonding wire and the switching element.

19. The semiconductor device according to claim 18, wherein each of the first and second slits is provided extending from an outer periphery of the semiconductor element toward a central region of the supporting substrate.

20. The semiconductor device according to claim 18, wherein
the first slits extend from a first side portion of the semiconductor element toward a central region of the supporting substrate, and
the second slits extend from a second side portion of the semiconductor element toward the central region of the supporting substrate, the second side portion being opposite to the first side portion.

21. The semiconductor device according to claim 18, wherein
a shape of the first slit in the supporting substrate is substantially identical to that of the first slit in the third electrode pad, and
a shape of the second slit in the supporting substrate is substantially identical to that of the second slit in the fourth electrode pad.

22. The semiconductor device according to claim 18, wherein
the second electrode pad of the mounting substrate overlaps with the semiconductor element,
at least part of the second electrode pad protrudes outward from an outer periphery of the semiconductor element in a surface direction of the mounting substrate, and
at least part of the second conductive bonding agent has a surface inclined toward an outer periphery of the protruding part of the second electrode pad.

23. The semiconductor device according to claim 18, wherein a length of each of the first slits is at least four times as large as a height of the first slits and at least four times as large as a width of the first slits.

24. The semiconductor device according to claim 18, wherein a length of each of the second slits is at least four times as large as a height of the second slits and at least four times as large as a width of the second slits.

25. The semiconductor device according to claim 18, wherein the first slits and the second slits do not extend into the central region of the supporting substrate.

26. The semiconductor device according to claim 18, wherein a length of each of the first slits is less than a distance from a first side surface of the semiconductor element in which an opening of each of the first slits is provided in the switching element to a second side surface of the semiconductor element opposite to the first side surface.

* * * * *